United States Patent [19]

Street et al.

[11] 4,042,838
[45] Aug. 16, 1977

[54] MOS INVERTING POWER DRIVER CIRCUIT

[75] Inventors: Dana C. Street, Placentia; Clarence W. Padgett, Westminster, both of Calif.

[73] Assignee: Rockwell International Corporation, El Segundo, Calif.

[21] Appl. No.: 709,464

[22] Filed: July 28, 1976

[51] Int. Cl.² .................................... H03K 17/60
[52] U.S. Cl. .................... 307/270; 307/251; 307/DIG. 4
[58] Field of Search .......... 307/205, 214, 251, 246, 307/270, DIG. 4

[56] References Cited

U.S. PATENT DOCUMENTS

| | | |
|---|---|---|
| 3,631,267 | 12/1971 | Heimbigner .................. 307/270 |
| 3,988,617 | 10/1976 | Price ...................... 307/DIG. 4 X |
| 3,995,171 | 11/1976 | Sonoda ..................... 307/DIG. 4 X |
| Re. 27,305 | 3/1972 | Polkinghorn et al. .......... 307/270 X |

OTHER PUBLICATIONS

Boss et al., "Powering Delay Circuit;" *IBM Tech. Discl. Bull.;* vol. 16, No. 1, pp. 17-18; 6/1973.
Daniels et al.; "Field-Effect Transistor Push-Pull Driver;" *IBM Tech. Discl. Bull.;* vol. 17, No. 10, pp. 2961-2962, 3/1975.
Chu et al.; "Bootstrap Push-Pull Driver;" IBM Tech. Discl. Bull.; vol. 18, No. 3, pp. 710-711; 8/1975.

*Primary Examiner*—John S. Heyman
*Assistant Examiner*—Larry N. Anagnos
*Attorney, Agent, or Firm*—H. Fredrick Hamann; G. Donald Weber, Jr.; Morland Charles Fischer

[57] ABSTRACT

An improved, compact high-speed inverting power driver fabricated from field effect transistors and capable of driving a relatively heavy load to full $-V_{DD}$ power supply voltage. The power driver includes a pair of positive feedback circuits having respective bootstrap capacitors arranged therein. The bootstrap capacitors are initially precharged, and the feedback paths act to substantially boost the voltage applied to operate a driver transistor so as to enable the load to be ultimately driven to a full $-V_{DD}$ voltage level via the conduction path of the driver transistor.

10 Claims, 7 Drawing Figures

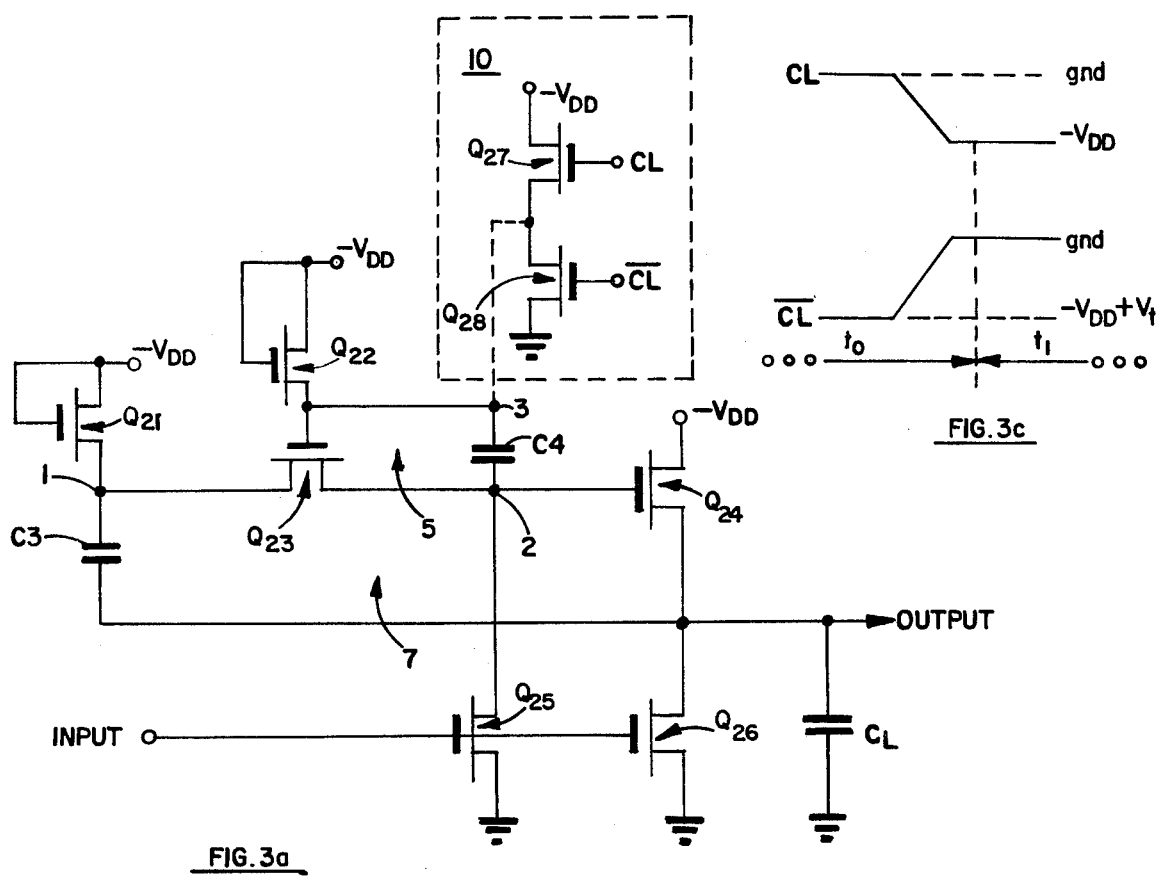
FIG.3a
FIG.3c
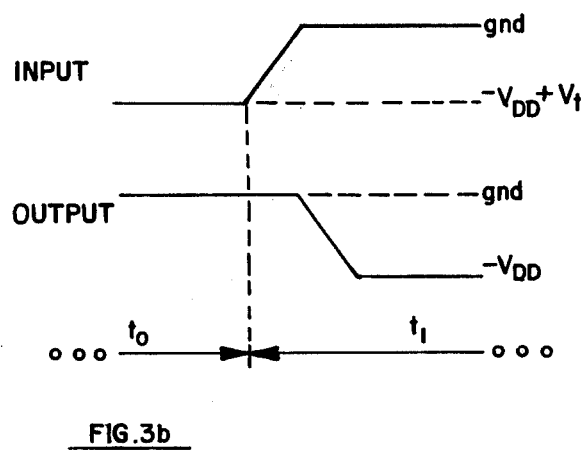
FIG.3b

MOS INVERTING POWER DRIVER CIRCUIT

BACKGROUND OF THE INVENTION

1. Field of the Invention

This invention relates to a high-speed, inverting power driver circuit fabricated from field effect transistors and capable of driving a relatively heavy capacitive load of full $-V_{DD}$ power supply voltage.

2. Prior Art

Examples of conventional circuits utilized to drive relatively heavy capacitive loads include the following:

U.S. Pat Nos. 3,286,189; Nov. 15, 1976; 3,710,271; Jan. 9, 1973; 3,769,528; Oct. 30, 1973; 3,806,738; Apr. 23, 1974;

However, many of the conventional driver circuits are formed by the relatively complex interconnection of many transistor devices. This consequently results in numerous parasitic capacitances which must first be charged before the circuit is suitable for driving a load to full $-V_{DD}$ supply voltage. Moreover, when large capacitive loads are to be driven, many conventional circuits undesirably introduce an inherent time delay for precharging circuit capacitors, which delay adversely affects circuit performance (where high-speed operation is required), while making high-frequency, low voltage applications impractical.

Other conventional driver circuits which are more compactly arranged are not capable of driving their respective loads to a full $-V_{DD}$ power supply voltage level, thereby causing the circuits to be unacceptable for many driver applications.

SUMMARY OF THE INVENTION

A compact, high-speed circuit for implementing an inverting power driver is disclosed. The present power driver is capable of driving a relatively heavy capacitive load to a full $-V_{DD}$ power supply voltage level. The circuit is fabricated from a comparatively small number of field effect transistor devices and consumes less area and power than conventional power drivers.

The circuit includes a pair of positive feedback paths, each path containing a respective bootstrap capacitor arranged therein. During a precharge interval of time, when the circuit input terminal is relatively negative, the circuit output terminal is driven relatively positive, and each of the bootstrap capacitors is suitably precharged. During a succeeding interval of time, the bootstrap action of the respective capacitors of the feedback paths substantially boosts the voltage applied to the control electrode of a driver transistor, which transistor is connected between the $-V_{DD}$ power supply and the circuit output terminal. Hence, when the circuit input terminal is driven relatively positive, the circuit output terminal and the load, which is connected to the output terminal, are driven relatively negative and to the full $-V_{DD}$ power supply voltage level via the conduction path of the driver transistor.

BRIEF DESCRIPTION OF THE DRAWINGS

FIG. 1b illustrates the waveforms of signals applied to the respective input and output terminals of the clock amplifier of FIG. 1a.

FIG. 2a shows a conventional source follower driver circuit which is also utilized for driving relatively heavy loads.

FIG. 2b illustrates the waveforms of signals applied to the respective input and output terminals of the source follower driver of FIG. 2a.

FIG. 3a shows the improved inverting power driver circuit of the instant invention.

FIG. 3b illustrates the waveforms of signals applied to the respective input and output terminals of the improved power driver of FIG. 3a.

FIG. 3c illustrates the waveforms of control signals which are applied to the respective terminals of a circuit to minimize power dissipation, said circuit comprising an alternate embodiment in the power driver circuit of FIG. 3a.

DESCRIPTION OF THE PREFERRED EMBODIMENT

Figure 1A:
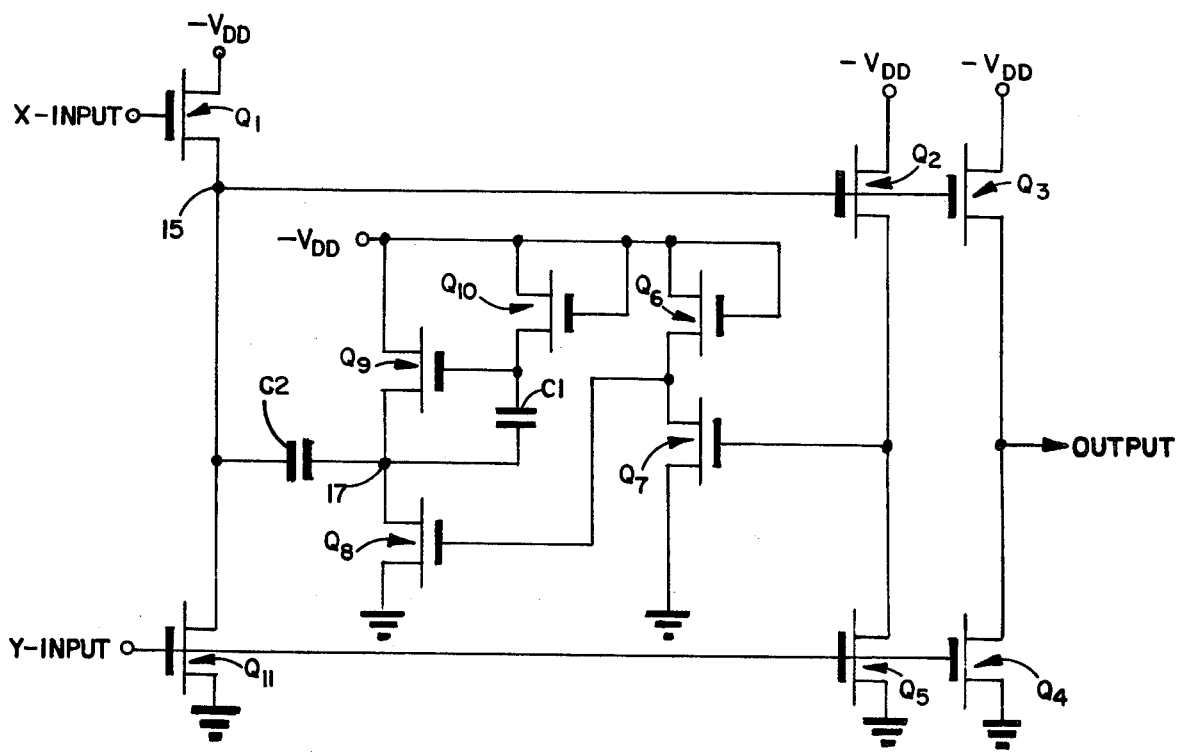
FIG. 1a shows a conventional clock amplifier circuit which may be used to drive a relatively heavy load to full $-V_{DD}$ power supply voltage.

Referring to FIG. 1a, one example of a conventional clock amplifier circuit, which may be used to drive a relatively heavy load to full power supply voltage, designated $-V_{DD}$, is illustrated. A detailed description of such a conventional clock amplifier is found in U.S. Pat. No. 3,714,466, issued Jan. 30, 1973. Therefore, the following represents only a brief description of a conventional clock amplifier circuit.

Figure 1B:
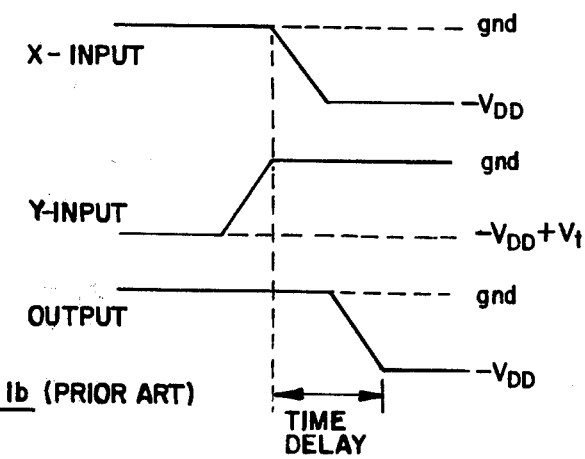

The clock amplifier of FIG. 1a is formed by the interconnection of 11 transistors $Q_1 - Q_{11}$, as shown. Referring concurrently to FIGS. 1a and 1b, the operation of the clock amplifier circuit is briefly described as follows. As the Y-input terminal is driven towards ground, the X-input terminal is driven negative, typically towards the $-V_{DD}$ power supply voltage. Transistor $Q_1$ is thereupon rendered conductive, and transistor $Q_{11}$ is rendered non-conductive. Thus, a common electrical junction, designated node 15 and formed by one conduction path electrode of transistors $Q_1$ and $Q_{11}$, one plate of capacitor C2, and the control electrode of transistors $Q_2$ and $Q_3$, is initially driven negative via the conduction path of transistor $Q_1$ to a voltage, $-V_{DD} + V_t$, that is one threshold level more positive than the $-V_{DD}$ supply voltage. As node 15 begins to go negative, capacitor C2 is precharged, because a common electrical junction, designated node 17 and formed by one conduction path electrode of transistors $Q_8$ and $Q_9$ and one plate of capacitors C1 and C2 (i.e. the second plate thereof), is clamped to ground via the conduction path of transistor $Q_8$. Transistors $Q_2$ and $Q_5 - Q_{10}$ form a time delay circuit which is used to boost the voltage of node 17 to full $-V_{DD}$ voltage level after capacitor C2 has had sufficient time to be precharged. Capacitor C2 is selected to be relatively large so that when node 17 is driven to the $-V_{DD}$ level via the conduction path of transistor $Q_9$, capacitor C2 will subsequently boost node 15 to at last one threshold level in voltage more negative than source voltage $-V_{DD}$. Inasmuch as node 15 is connected to the gate electrode of transistor $Q_3$, transistor $Q_3$ is rendered conductive in a fashion to drive the circuit output terminal to full $-V_{DD}$ level.

Figures 2A, 2B:
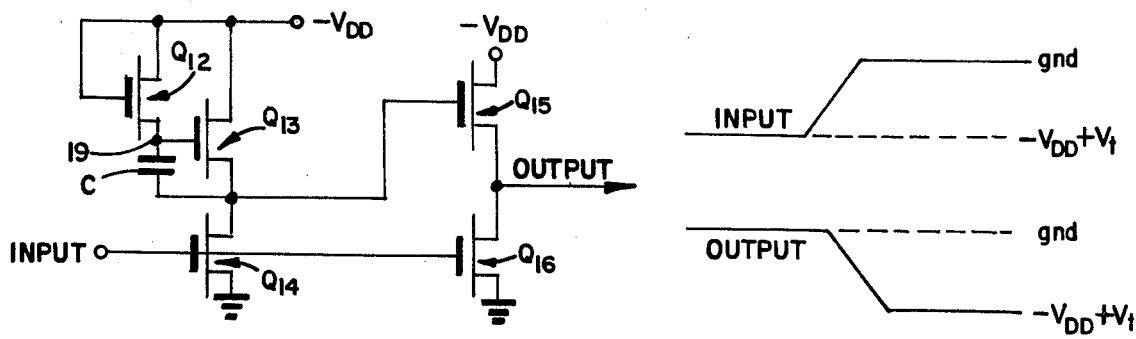

Another conventional circuit which is utilized to drive relatively heavy loads is a source follower driver, one example of which is illustrated in FIG. 2a. Reference may be made to U.S. Pat. No. 3,506,851, issued Apr. 14, 1970, for a detailed description of the operation of such a conventional source follower driver. However, referring concurrently to FIGS. 2a and 2b, the operation of the source follower driver is briefly described as follows. The circuit of FIG. 2a includes five transistors $Q_{12} - Q_{16}$, as shown. When the source follower driver input terminal is driven to ground, transistors $Q_{14}$ and $Q_{16}$ are rendered non-conductive. A capacitor C and a common electrical junction, designated node 19 and formed by one conduction path electrode of transistors $Q_{12}$, the control electrode of transistor $Q_{13}$, and one plate of the capacitor C, are both precharged via the conduction path of transistor $Q_{12}$. Hence, output driver transistor $Q_{15}$ is rendered conductive, and the source follower output terminal is ultimately driven to a voltage, $-V_{DD} + V_t$, that is one threshold level more positive than the $-V_{DD}$ supply voltage, via the conduction path of transistor $Q_{15}$.

A circuit for implementing the improved MOS inverting power driver in accordance with the instant invention to drive a relatively heavy capacitive load, designated $C_L$, is shown in FIG. 3a. The circuit is comprised of a plurality of p-channel metal oxide semiconductor field effect transistors (MOSFETs), but it is to be understood that these or other suitable semiconductor devices may be utilized as well. A first MOSFET $Q_{21}$ has a control (i.e. gate) electrode and one conduction path electrode thereof connected together and to a terminal of a suitable power supply, $-V_{DD}$. For example, power supply $-V_{DD}$ may be approximately $-17$ volts dc. The second conduction path electrode of FET $Q_{21}$ is connected at a common electrical junction 1 formed by one plate of a first capacitor C3 and one conduction path electrode of a FET $Q_{23}$. The second plate of capacitor C3 is connected to the circuit output terminal. The second conduction path electrode FET $Q_{23}$ is connected at a common electrical junction 2 formed by one plate of a second capacitor C4, the gate electrode of an output driver FET $Q_{24}$, and one conduction path electrode of a FET $Q_{25}$. The gate electrode of FET $Q_{23}$ is connected at a common electrical junction 3 formed by the second plate of capacitor C4 and one conduction path electrode of a FET $Q_{22}$. The gate and the second conduction path electrodes of FET $Q_{22}$ are connected to a terminal of the power supply $-V_{DD}$. The second conduction path electrode of FET $Q_{25}$ is connected to a source of reference potential, such as ground.

In a preferred embodiment, and as will be discussed in greater detail hereinafter, the sizes (e.g. channel widths) of FETs $Q_{21}$, $Q_{23}$, and $Q_{25}$ are ratioed. That is, the channel width of FET $Q_{21}$ is chosen to be larger than the corresponding channel width of FET $Q_{25}$, which is chosen to be larger than the channel width of FET $Q_{23}$. By way of example, the widths of FETs $Q_{21}$, $Q_{25}$, and $Q_{23}$ may be conveniently chosen according to the ratio 10: 6: 1, respectively, in order to provide suitable precharge voltages across capacitors C3 and C4. It is to be understood that the particular channel widths of FETs $Q_{21}$, $Q_{23}$, and $Q_{25}$ vary according to the size of FET $Q_{24}$, which typically has a wide channel width and a large input capacitance. In another preferred embodiment, also to be described in greater detail hereinafter, the size of capacitor C3 is chosen to be substantially larger than capacitor C4 and according to the ratio of the (relatively large) input capacitance of FET $Q_{24}$ to the (relatively smaller) input capacitance of FET $Q_{23}$.

A first conduction path electrode of output driver FET $Q_{24}$ is connected to a terminal of the power supply $-V_{DD}$. The second conduction path electrode of FET $Q_{24}$ is connected at a common electrical junction formed by the circuit output terminal, the second plate of capacitor C3 and a first conduction path electrode of a FET $Q_{26}$. The second conduction path electrode of FET $Q_{26}$ is connected to a source of reference potential, such as ground. The circuit input terminal is connected to each of the gate electrode of FETs $Q_{25}$ and $Q_{26}$.

The operation of the inverting power driver circuit of the present invention is described by concurrently referring to FIGS. 3a and 3b. During a precharge interval of time, designated $t_O$ in FIG. 3b, the circuit input terminal is relatively negative (typically a threshold level more positive than $-V_{DD}$). Inasmuch as the input terminal is connected to the gate electrodes of FETs $Q_{25}$ and $Q_{26}$, FETs $Q_{25}$ and $Q_{26}$ are rendered conductive. Common electrical junction 2 and the circuit output terminal are clamped approximately to ground via the conduction paths of FETs $Q_{25}$ and $Q_{26}$, respectively. Since FET $Q_{21}$ is chosen with a relatively wide channel width (and, therefore, a relatively low forward-on resistance), common electrical junction 1 is precharged to approximately $-V_{DD} + V_t$ (i.e. the source voltage, $-V_{DD}$, plus a threshold level drop in voltage, $V_t$, of FET $Q_{21}$). FET $Q_{23}$ is rendered conductive, inasmuch as the gate electrode thereof is clamped to the power supply voltage $-V_{DD}$ via the conduction path of FET $Q_{22}$.

Since FET $Q_{23}$ is chosen with a substantially narrower channel width (and, therefore, a substantially higher forward-on resistance) than that of FET $Q_{25}$, the clamping of electrical junction 2 to ground is maintained during the $t_O$ interval. Hence, a dc current path is established from the source of reference potential, ground, to the power supply, $-V_{DD}$, via the series connected conduction paths of FETs $Q_{25}$, $Q_{23}$ and $Q_{21}$. The narrow width of FET $Q_{23}$ also helps to minimize the current through FET $Q_{25}$. Moreover, the relatively large resistance of FET $Q_{23}$ results in a correspondingly large voltage drop (e.g. $-11$ volts d.c.) across the conduction path electrodes of FET $Q_{23}$. Therefore, a large negative voltage drop is also provided across the plates of capacitor C3, inasmuch as during the precharge interval $t_O$, capacitor C3 and FET $Q_{23}$ are electrically connected in parallel with respect to one another. The relatively large negative voltage drop across capacitor C3 is maintained as long as FETs $Q_{21}$ and $Q_{23}$ are rendered conductive. Capacitor C4, connected between electrical junctions 3 and 2, is negatively charged to $-V_{DD} + V_t$ (e.g. approximately $-13$ volts) via the conduction paths of FET $Q_{22}$ (through which no dc current flows) and FET $Q_{25}$ during the $T_O$ precharge interval. The gate electrode of output driver FET $Q_{24}$ is clamped approximately to ground via electrical junction 2 and the conduction path FET $Q_{25}$. FET $Q_{24}$ is, thereby rendered non-conductive, and no leakage current flows therethrough. Therefore, during the precharge interval $t_O$ when the circuit input terminal is negative, the circuit output terminal is clamped to ground (via FET $Q_{26}$) and capacitors C3 and C4 are precharged to negative voltage levels.

During the succeeding interval of time, designated $t_1$ in FIG. 3a, a relatively positive signal (e.g. one driven toward ground) is applied to the circuit input terminal. Inasmuch as the circuit input terminal is connected to the gate electrodes of FETs $Q_{25}$ and $Q_{26}$, FETs $Q_{25}$ and $Q_{26}$ are simultaneously rendered non-conductive. Common electrical junction 2 is no longer clamped to ground, but is negatively charged by the $-V_{DD}$ power supply via the conduction paths of FETs $Q_{21}$ and $Q_{23}$. Because the gate electrode of output driver FET $Q_{24}$ is connected to electrical junction 2, FET $Q_{24}$ is rendered conductive.

The signal at electrical junction 2 is applied to electrical junction 3 and to the gate electrode of FET $Q_{23}$ via a first positive feedback path 5 including a bootstrap circuit formed by capacitor C4. FET $Q_{22}$ is, thereby, rendered non-conductive, because of insufficient threshold potential at the gate electrode thereof. As the circuit output terminal is driven towards the $-V_{DD}$ power supply voltage via the conduction path of FET $Q_{24}$, the negative signal is applied from the output terminal to electrical junction 1 via a second positive feedback path 7 to boost the voltage of junction 1 to approximately one threshold level more negative than that of the $-V_{DD}$ supply voltage. Feedback path 7 includes the conduction path of FET $Q_{23}$ and a bootstrap circuit formed by capacitor C3. FET $Q_{21}$ is, thereupon, rendered non-conductive, because of insufficient threshold potential at the gate electrode thereof. However, the conductivity of FET $Q_{23}$ is maintained and aided during the $t_1$ interval, inasmuch as the first and second positive feedback paths 5 and 7 including capacitors C4 and C3, respectively, provide a double bootstrap of electrical junction 3 so as to substantially boost the voltage thereof (to approximately two threshold levels more negative than $-V_{DD}$) and thereby insure the application of sufficient threshold potential to the gate electrode of FET $Q_{23}$. Moreover, the channel capacitance of FET $Q_{23}$ also bootstraps electrical junction 3. FET $Q_{23}$ is, therefore, turned on hard (i.e. the inherent resistance of FET $Q_{23}$ is substantially minimized resulting in inconsequential voltage drop across the conduction path electrodes thereof) so that the voltages of electrical junctions 1 and 2 become substantially equivalent. The voltage at electrical junction 2 is boosted (i.e. to one threshold level more positive than the voltage applied to double bootstrapped electrical junction 3) as a result of positive feedback path 7, so that capacitor C3 ultimately bootstraps both electrical junctions 1 and 2 (via FET $Q_{23}$). Hence, driver FET $Q_{24}$ is also turned on hard, and the conduction thereof is maintained and aided. Therefore, during the $t_1$ interval when the circuit input terminal is driven towards ground, the circuit output terminal reaches full voltage supply level, $-V_{DD}$, via the conduction path of output driver FET $Q_{24}$, to drive load $C_L$. The circuit is reinitialized (i.e. precharged) during a subsequent $t_0$ time interval when the input terminal is again driven by a relatively negative signal.

In an alternate embodiment, FET $Q_{22}$ may be replaced by a pair of clocked transistors, FETs $Q_{27}$ and $Q_{28}$, as part of a circuit to minimize power dissipation. The conduction paths of FETs $Q_{27}$ and $Q_{28}$ are electrically connected together in series between the power supply, $-V_{DD}$, and the source of reference potential, ground. The gate electrodes of FETs $Q_{27}$ and $Q_{28}$ are connected to suitable clock terminal means to receive complementary control signals, designated CL and $\overline{CL}$, respectively. FETs $Q_{27}$ and $Q_{28}$ are connected to the instant power driver from a convenient point between the conduction paths thereof to the common electrical junction 3 formed by the gate electrode of FET $Q_{23}$ and capacitor C4.

In operation and concurrently referring to FIGS. 3a and 3c for a standby condition during the aforementioned $t_0$ precharge time interval, the gate electrode of FET $Q_{27}$ is driven to ground by the clock control signal CL, and the gate electrode of FET $Q_{28}$ is driven to $-V_{DD} + V_t$ by the complementary clock control signal $\overline{CL}$. It is to be understood, however, that the CL and $\overline{CL}$ control signals need not be limited to clock signals, but may also be complementary chip enable signals, as known to those skilled in the art, or the like. Hence FET $Q_{28}$ is rendered conductive, and FET $Q_{27}$ is rendered non-conductive. FET $Q_{28}$ drives electrical junction 3 to ground via the conduction path thereof, thereby rendering FET $Q_{23}$ non-conductive. Disabling FET $Q_{23}$ has the effect of disconnecting the previously disclosed dc current path therethrough so that no power is dissipated by the circuit during standby. Moreover, capacitor C3 is precharged (via the conduction path of FET $Q_{21}$, which is still rendered conductive), and capacitor C4 is discharged at node 3 (via the conduction path of FET $Q_{28}$).

During a subsequent portion of the $t_0$ time interval, the gate electrode of FET $Q_{27}$ is driven to $-V_{DD}$ by control signal CL, and the gate electrode of FET $Q_{28}$ is driven to ground by complementary control signal $\overline{CL}$. Hence, FET $Q_{28}$ is rendered non-conductive, and FET $Q_{27}$ is rendered conductive so as to precharge the gate electrode of FET $Q_{23}$ and capacitor C4 at electrical junction 3 (via the conduction path of FET $Q_{27}$). Capacitor C3 remains precharged during this portion of the $t_0$ interval. The succeeding $t_1$ time interval may now commence, since both capacitors C3 and C4 are precharged for desired operation of feedback paths 5 and 7.

The precharging of bootstrap capacitor C3 during the $t_0$ time interval and before the circuit input terminal is driven to ground enhances the speed of the disclosed inverting power driver circuit with respect to that of prior art circuits. Since capacitor C3 remains charged during both the $t_0$ and $t_1$ intervals, it can begin to boost the voltage level of electrical junction 1 during the $t_1$ interval as soon as the circuit input terminal is driven to within one threshold level of ground without the inherent time delay introduced by many of the conventional driver circuits. Moreover, the presently improved inverting power driver circuit combines the simplicity of a conventional source follower driver (FIG. 2a) with the full power supply driving capability of a conventional clock amplifier (FIG. 1a). What is more, the improved circuit is comprised of only six transistors (FETs $Q_{21} - Q_{26}$), thereby minimizing overall space consumption, cost, and power dissipation.

It will be apparent that while a preferred embodiment of the invention has been shown and described, various modifications and changes can be made without departing from the true spirit and scope of the invention. For example, as still another power saving embodiment of FIG. 3a, FETs $Q_{27}$ and $Q_{28}$ of circuit 10 may be replaced by connecting the drain electrode of FET $Q_{22}$ to the CL control terminal instead of to the $-V_{DD}$ power supply terminal, as shown. Thus, when the CL terminal is driven to ground, electrical junction 3 is clamped to ground via the conduction path of FET $Q_{22}$. Hence, FET $Q_{23}$ is rendered non-conductive, and the dc current path therethrough is disabled until electrical junction 3 is again precharged when the drain electrode of FET $Q_{22}$ is driven to $-V_{DD}$ by the CL control terminal (during the succeeding $t_0$ time interval). It is also to be understood that bootstrap capacitor C4 can be eliminated by using a FET $Q_{23}$ with a longer and wider channel region so as to preserve the on-resistance but increase the gate capacitance thereof. Thus the increased gate capacitance of FET $Q_{23}$ provides the feedback otherwise provided by capacitor C4, as illustrated.

Having thus set forth a a preferred embodiment of the invention, what is claimed is:

1. A high-speed circuit having signal source means, an input terminal, an output terminal, and utilization means connected to said output terminal to be driven therefrom by a signal substantially equivalent to that of said source means, said circuit including:
   a plurality of multi-terminal semiconductor means having respective conduction path terminals and a control terminal and interconnected between said input and output terminals;
   first and second capacitance means;
   a first and second of said plurality of semiconductor means respectively connected between said source means and said first and second capacitance means to precharge said first and second capacitance means;
   a third of said plurality of semiconductor means connected between said source means and said output terminal to supply a signal to said output terminal;
   a first feedback path connected between said output terminal and the control terminal of said third semiconductor means, said first feedback path comprising the first of said capacitance means and the conduction path of a fourth of said semiconductor means; and
   a second feedback path connected between the control terminal of said third semiconductor means and a control terminal of said fourth semiconductor means, said second feedback path comprising the second of said capacitance means;
   said second feedback path substantially boosting the signal applied to the control electrode of said fourth semiconductor means to thereby enable said fourth semiconductor means and said first feedback path;
   said first feedback path substantially boosting the signal applied to the control terminal of said third semiconductor means to enable said third semiconductor means and thereby supply said output terminal with a signal via the conduction path of said third semiconductor means to drive said utilization means, which signal is substantially equivalent to that of said source means.

2. The circuit recited in claim 1, wherein each of said plurality of multi-terminal semiconductor means is a field effect transistor.

3. The circuit recited in claim 1, wherein the capacitance of said first capacitance means is substantially larger than that of said second capacitance means.

4. The circuit recited in claim 1, wherein the on-resistance of said third semiconductor means is substantially smaller than that of said fourth semiconductor means.

5. In combination:
   source means to provide a plurality of reference potentials;
   input terminal means;
   output terminal means;
   first and second capacitor means;
   first field effect transitor means connected between said source means and said first capacitor means to charge said capacitor means to a first of said reference potentials;
   second field effect transistor means connected between said source means and said second capacitor means to charge said second capacitor means to the first of said reference potentials;
   third field effect transistor means connected between said source means and said output terminal means to apply a signal thereto;
   fourth field effect transistor means connected between a first electrical junction formed by the interconnection of said first field effect transistor means and said first capacitor means and a second electrical junction formed by the interconnection of said second capacitor means, the control electrode of said third field effect transistor means, and a fifth field effect transistor means,
   the control electrode of said fourth field effect transistor means connected to a third electrical junction formed by the interconnection of said second field effect transistor means and said second capacitor means;
   said fifth field effect transistor means connected between said second electrical junction and said source means; and
   sixth field effect transistor means connected between said output terminal means and said source means;
   said input terminal means connected to the control electrode of each of said fifth and sixth field effect transistor means so that each of said second electrical junction and said output terminal means receives a second of said plurality of reference potentials when a first input signal is applied to said input terminal means;
   said second capacitor means substantially boosting the signal applied to said third electrical junction to enable said fourth field effect transistor means, and said first capacitor means substantially boosting the signal applied to said first electrical junction and to said second electrical junction via said fourth field effect transistor means to enable said third field effect transistor means when a second input signal is applied to said input terminal means so as to thereby drive said output terminal means via said third transistor means.

6. The combination recited in claim 5, wherein the conduction paths of said first, fourth, and fifth field effect transistor means form a current path when said first input signal is applied to said input terminal means;
   the channel width of said first field effect transistor means being substantially larger than that of said fifth transistor means; and
   the channel width of said fifth field effect transistor means being substantially larger than that of said fourth transistor means.

7. A circuit having means for driving an output terminal thereof, said circuit including:
   source means;
   first and second capacitor means;
   first output driver field effect transistor means connected between said source means and said output terminal;
   second field effect transistor means connected between said first and second capacitor means;
   means to charge said first and second capacitor means;
   said second capacitor means connected to bootstrap said second transistor means and thereby enable said second transistor means; and
   said first capacitor means connected to bootstrap said first output driver transistor means via the conduction path of said second transistor means and thereby enable said first output driver transistor means in order to drive said output terminal via the conduction path of said first transistor means.

8. The circuit recited in claim 7, wherein the means to charge said second capacitor means includes third and fourth field effect transistor means;
first conduction path terminals of each of said third and fourth transistor means connected to said source means;
second conduction path terminals of each of said third and fourth transistor means connected to said second capacitor means; and
control terminals of each of said third and fourth transistor means connected to a source of enabling signals.

9. The circuit recited in claim 8, wherein the conduction paths of said third and fourth field effect transistor means are connected in electrical series.

10. The circuit recited in claim 8, wherein said source of enabling signals is a clock signal source means;
said clock signal source means supplying complementary clock control signals to the respective control terminals of said third and fourth field effect transistor means.

* * * * *